United States Patent [19]

Desjardins

[11] Patent Number: 4,510,432

[45] Date of Patent: Apr. 9, 1985

[54] GENERATION OF VECTORS

[75] Inventor: Francois G. Desjardins, Maryhill, Canada

[73] Assignee: Electrohome Limited, Kitchener, Canada

[21] Appl. No.: 464,490

[22] Filed: Feb. 7, 1983

[51] Int. Cl.[3] ........................ G06F 3/13; H03K 13/02

[52] U.S. Cl. ................................ 320/1; 340/347 DA; 364/520

[58] Field of Search .................... 320/1; 318/569, 574; 364/520, 718–722; 340/347 A, 347 DA

[56] References Cited

U.S. PATENT DOCUMENTS

| | | | |
|---|---|---|---|
| 3,681,773 | 8/1972 | Russell et al. | 318/569 X |
| 3,918,046 | 11/1975 | Rivers | 340/347 DA |
| 4,283,765 | 8/1981 | Rieger | 364/520 X |
| 4,410,879 | 10/1983 | Gumm | 340/347 DA |
| 4,430,641 | 2/1984 | Baur | 340/347 DA |

*Primary Examiner*—R. J. Hickey

*Attorney, Agent, or Firm*—Sim & McBurney

[57] ABSTRACT

A vector generator includes a linear charge pump in the form of a DAC with a constant but variable current output that can charge a capacitor connected between the output and one of the input terminals of an operational amplifier. A second constant current generator having an output current one-half that of the maximum output current of the DAC and of opposite polarity also is provided for charging the capacitor, the constant current generators being so connected to the capacitor that it can be charged either positively or negatively. A switching network controls whether the capacitor is charging or not depending on the state of the switching network. A second DAC with a constant but variable output voltage is provided and produces an output indicative of the coordinate of the vector to be drawn. The voltage on the capacitor is compared to the output voltage of the second DAC, and, when they are equal, a control signal is produced that changes the state of the switch to terminate charging of the capacitor.

16 Claims, 9 Drawing Figures

GENERATION OF VECTORS

BACKGROUND OF THE INVENTION

This invention relates to methods and apparatus for drawing vectors on an XY monitor, for example.

In order to draw computer controlled vectors on an XY monitor it is known to employ a digital to analog converter, hereinafter referred to as a DAC. One conventional technique for drawing computer controlled vectors employs a monolithic DAC and counters which change the XY signal in steps. The problem with such a technique is that the steps limit resolution and produce noise that is visible on the XY monitor.

Another conventional technique for drawing computer controlled vectors makes use of reactive components. This technique results in high resolution and clean signals but causes drifting errors.

In accordance with the present invention the aforementioned problems are overcome by a vector generation technique employing monolithic DACs and reactive components.

SUMMARY OF THE INVENTION

According to one aspect of this invention there is provided a vector generator comprising first means for providing a signal indicative of the rate at which said vector is to be drawn, said first means comprising an operational amplifier having an output terminal and first and second input terminals, means connecting said first input terminal to a source of reference potential, a capacitor connected between said output terminal and said second input terminal, a constant current DAC having multiple input terminals and an output terminal at which a constant but variable output current is derived and a second constant current generator providing a constant current of opposite polarity to that of said DAC and one-half the magnitude of the maximum output current of said DAC, said DAC and said second constant current generator being connected to said second terminal and said capacitor in such a way that, depending on the magnitude of said output current of said DAC, said capacitor can be charged either positively or negatively; switching means having a first state and a second state, said switching means interconnecting said capacitor with both said DAC and said second constant current generator and enabling said capacitor to be charged in said first state of said switching means but preventing said capacitor from being charged in said second state of said switching means; second means for providing a signal indicative of the length of said vector to be drawn, said second means comprising a constant voltage DAC having multiple input terminals and an output terminal at which a constant but variable output voltage indicative of said length is derived; third means for comparing said output voltage of said constant voltage DAC and the voltage across said capacitor and generating a control signal when said voltages are equal; fourth means for utilizing said control signal to charge said state of said switching means from said first state thereof to said second state thereof to prevent further charging of said capacitor; fifth means for supplying to said input terminals of said constant current DAC a first signal that determines the rate at which said vector is to be drawn, to said input terminals of said constant voltage DAC a second signal that determines the length of said vector to be drawn and to said switching means a third signal that changes said state of said switching means from said second state to said first state thereof to enable said capacitor to be charged.

BRIEF DESCRIPTION OF THE DRAWINGS

This invention will become more apparent from the following detailed description, taken in conjunction with the appended drawings, in which.

DETAILED DESCRIPTION OF THE INVENTION INCLUDING THE PREFERRED EMBODIMENTS

Figure 1:
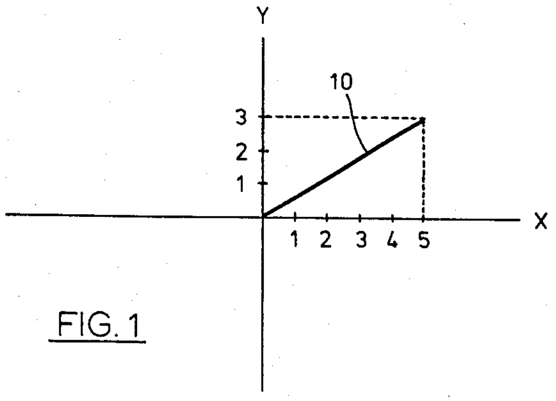
FIG. 1 shows a vector to be generated.

Referring first to FIG. 1, by way of example there is shown on an XY plot a vector 10 that is 5.83 units long, extends at a 31° angle to the X axis, has starting coordinates (X,Y) of 0,0 and finishing coordinates of 5,3.

To draw vector 10 on an XY monitor two signals must be applied, an X signal and a Y signal. The Y signal must increase linearly from 0 to 3 and then stop. The X signal must increase linearly from 0 to 5 and then stop. In addition both the X and Y signals must start and stop at the same time. Obviously, in the present instance this means that the velocity at which the X signal is drawn must be 5/3 greater than the velocity at which the Y signal is drawn.

It follows from the foregoing that a vector generator should have the following two characteristics:

(a) Linear and controlled rate of change;

(b) Controlled stopping of both the X and Y signals.

Figure 2:
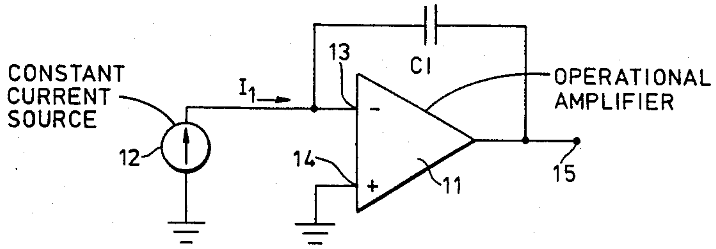
FIGS. 2 to 7 inclusive either are identical to or schematic representations of various parts of the vector generator of FIG. 8 that are useful in explaining the nature and functions of such parts.

In order to provide linear rate of change a linear charge pump is required. Such a linear charge pump is shown in FIG. 2 and comprises an operational amplifier 11 with negative feedback and a constant current source 12. Operational amplifier 11 has − and + input terminals 13 and 14 respectively and an output terminal 15. Negative feedback is achieved by connecting input terminal 13 and output terminal 15, this being accomplished in this case via a capacitor Cl. Input terminal 14 is connected to a source of reference potential, in this case ground potential, while one terminal of constant current source 12 also is grounded and the other is connected to input terminal 13 and capacitor Cl.

A constant current I, flowing as shown in FIG. 2 will charge capacitor Cl very linearly causing a linear increase in voltage at output terminal 15. As a result of the negative feedback between output terminal 15 and input terminal 13, the output voltage of operational amplifier 11 will, as is well known, attempt to maintain the difference in voltage between its two input terminals at 0 volts.

It also will be appreciated that by changing the magnitude of current $I_1$, the rate at which capacitor Cl charges can be varied.

Figure 3:
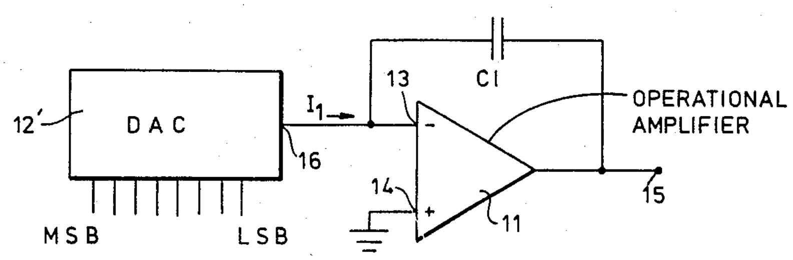

Turning now to FIG. 3, a practical form of a constant current generator that can be computer controlled is constituted by a DAC 12' with current output provided with, for example, eight input terminals and a current output terminal 16. By varying the input signal to the input terminals of DAC 12', the constant current output at output terminal 16 thereof can be varied.

In order to enable vectors to be drawn at various rates in all directions, the charging current of capacitor Cl not only must be variable in value but also in polarity. To this end it is necessary to be able to charge capacitor Cl negatively as well as positively and discharge capacitor Cl from an already charged state. This can be achieved, as shown in FIG. 4, by provision of a second constant current source 12*a*.

Constant current source 12*a* provides a constant current $I_2$ which should be of opposite polarity to constant current $I_1$ and one-half the maximum output current (Imax) of DAC 12'.

Figure 4:
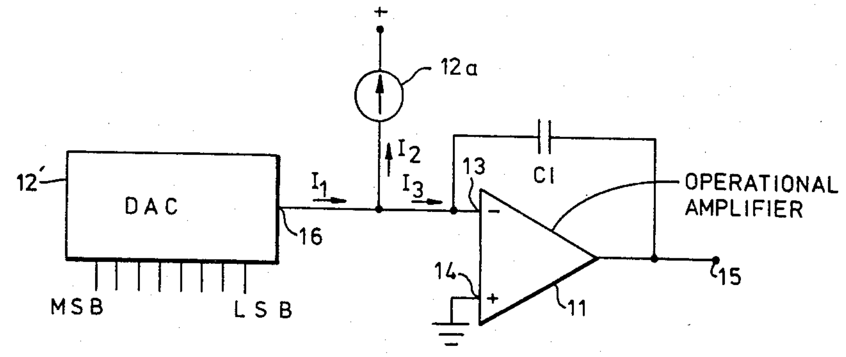

In order to illustrate the functioning of the circuitry shown in FIG. 4, assume that $Imax = I_1 = 2$ ma. This will occur when all bits to the eight inputs of DAC 12' are high, i.e., 11111111.

It can be seen from FIG. 4 that $$I_3 = I_1 - I_2$$

$$I_3 = Imax - (Imax/2)$$

$$I_3 = 2\ ma - 1\ ma$$

$$I_3 = 1\ \text{ma}$$

If all bits to the eight inputs of DAC 12' are low, i.e., 00000000, the output current $I_1$ of DAC 12' will be 0 ma. Therefore, $$I_3 = 0 - (Imax/2)$$

$$I_3 = 0 - 1\ \text{ma}$$

$$I_3 = -1\ \text{ma}$$

On the other hand, if the digital input to DAC 12' is 10000000, assuming an 8 bit DAC, the output current $I_1$ of DAC 12' will be Imax/2. Therefore $$I_3 = (Imax/2) - (Imax/2).$$

$$I_3 = 0\ \text{ma}$$

Thus, it can be seen from the foregoing that with the circuit shown in FIG. 4, and where $I_1$ and $I_2$ are of opposite polarity with $I_2 = I_1max/2$, a digital input 10000000 to DAC 12' will produce 0 charging current for capacitor Cl, while any higher input will produce a positive charging current and any lower input a negative charging current. As a consequence, the most significant bit (MSB) then can be used to control the polarity of the charging current.

Figure 5:
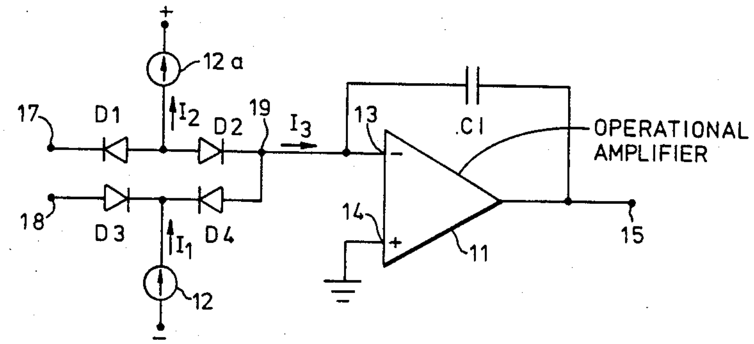

Switching circuitry is provided to control the charging of capacitor Cl. A part of one form of suitable switching circuitry is shown in FIG. 5 and includes diodes D1, D2, D3 and D4. Diodes preferably are employed for the required switching so that the switch is linear, fast, free of noise and does not produce bounce.

Diodes D1 and D2 are series connected but with opposing polarity between a terminal 17 and input terminal 13 of operational amplifier 11. One terminal of constant current source 12*a* is connected to the two electrodes (anodes) of diodes D1 and D2 that are connected together. Diodes D3 and D4 also are series connected with opposing polarity but between a terminal 18 and input terminal 13, and the polarities of diodes D3 and D4 are opposite to the polarities of diodes D1 and D2. One terminal of constant current source 12 is connected to the two electrodes (cathodes) of diodes D3 and D4 that are connected together.

By means to be disclosed hereinafter positive or negative potentials can be applied to terminal 17, while negative or positive potentials respectively can be applied to terminal 18. Consider the situation, for example, where terminal 18 is at −1 v and terminal 17 is at +1 v. Terminal 13 is maintained at 0 v by virtue of negative feedback, so it is apparent that current $I_1$ will flow from source 12 via diode D4 to terminal 19 and diode D3 will be reverse biased. Current $I_2$ will flow from the most negative source and thus will flow through diode D2 with diode D3 being reverse biased. Consequently, with −1 v applied to terminal 18 and +1 v applied to terminal 17, capacitor Cl will be charging and the switch can be considered as on.

When the polarities of the voltages applied to terminals 17 and 18 are reversed, current $I_1$ will flow through diode D3 with diode D4 being reverse biased. Current $I_2$ will flow through diode D1 with diode D2 being reverse biased. Under these conditions capacitor Cl is not charging and the switch can be considered as off.

Various ways of effecting simultaneous switching of the polarities of the voltages applied to terminals 17 and 18 are possible. In the system shown in FIG. 6 a differential amplifier generally designated 20 is employed for this purpose.

Transistor Q1 is a level shifter, always is turned on to some extent and has applied to its base electrode a voltage of either 0 v or +4 v. When the base voltage of transistor Q1 is +4 v, the base voltage of transistor Q2 will be about −4.3 v. Since the base voltage of transistor Q3 is −5.1 v, transistor Q2 will be on and transistor Q3 will be off, making terminal 17 positive and terminal 18 negative. On the other hand, when the base voltage of transistor Q1 is 0 v, the base voltage of transistor Q2 will be about −6.3 v, so transistor Q2 will be off and transistor Q3 will be on. Under these circumstances terminal 17 will be negative and terminal 18 will be positive.

Figure 8:
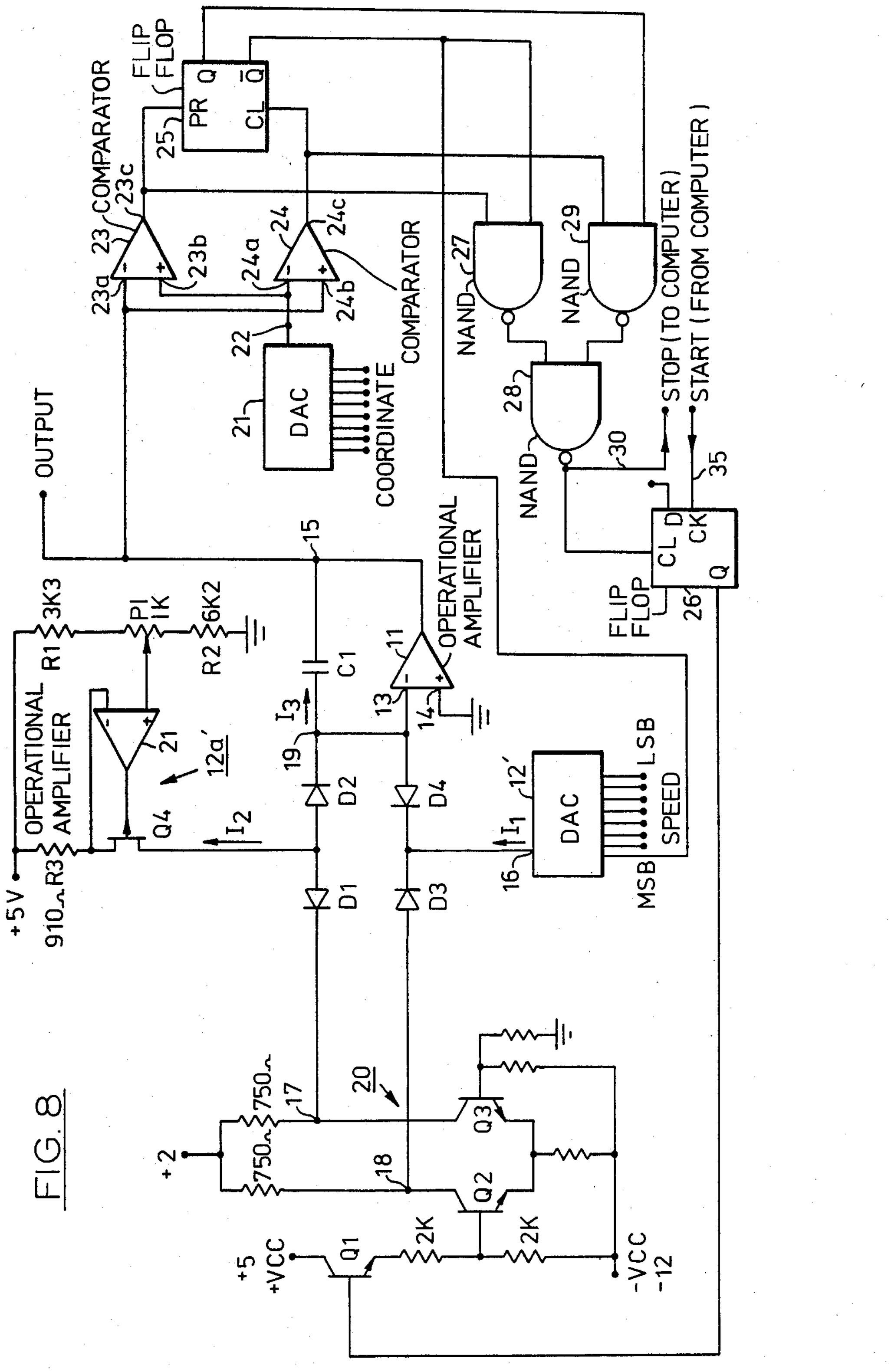
FIG. 8 is an illustration of a vector generator embodying the present invention.

The circuitry hitherto discussed is shown in FIG. 8. In that Figure constant current generator 12*a* is designated 12*a'* and is constituted by an FET Q4, an operational amplifier 21, potentiometer Pl and resistors R1, R2 and R3 connected as shown.

Figure 7:
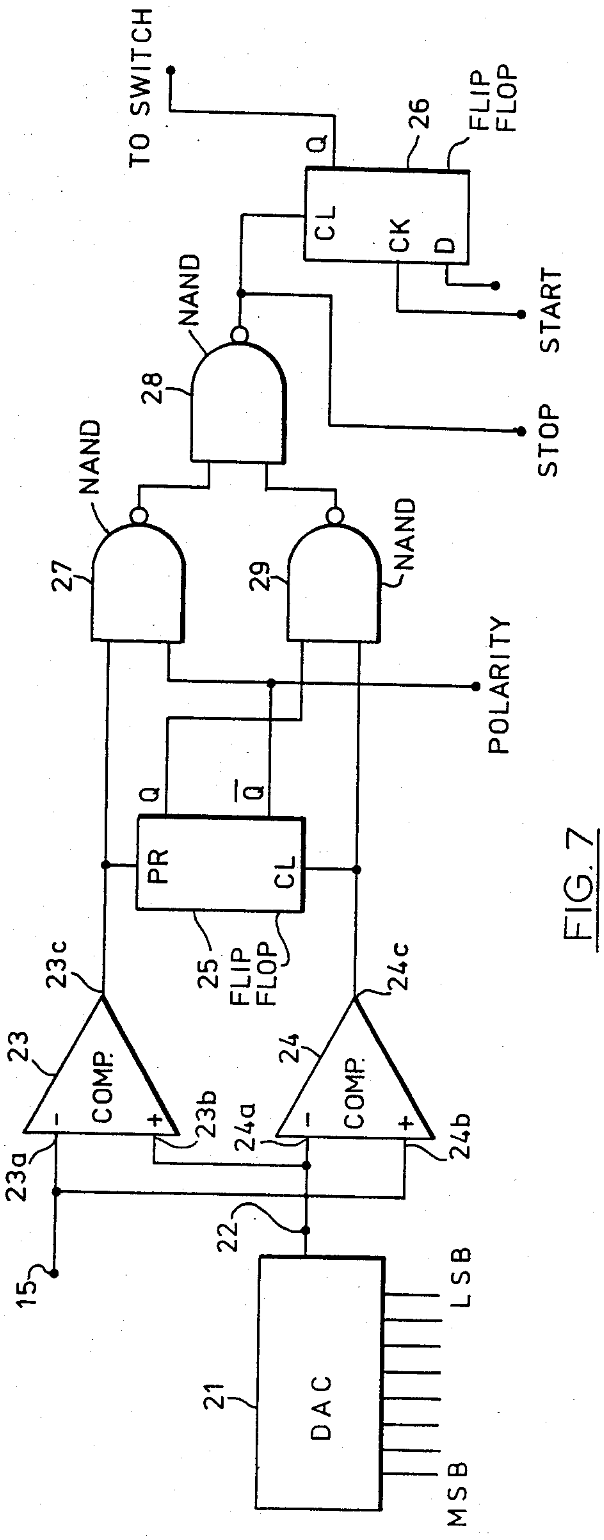

As previously indicated, the constant current generator that is constituted by DAC 12' controls the speed at which the vector is drawn in either the X direction or the Y direction. A second DAC 21 that is shown in FIG. 7 is of the constant voltage output type and provides at its output terminal 22 a constant but variable output voltage whose magnitude is dependent upon the digital input signal to the eight input terminals of DAC 21. The digital input signal to DAC 21 determines the finishing X (or Y) coordinate of the vector to be drawn. Thus, in the case of the vector shown in FIG. 1, if the circuitry hitherto discussed is to be used to provide the required vector in the X direction, the input to DAC 21 would produce an output therefrom at terminal 22 proportional to 5 units, and the input to DAC 12' would produce a charging rate for capacitor Cl 5/3 times as fast as the charging rate for the equivalent capacitor to be charged to provide the required vector in the Y direction. Of course, if the circuitry hitherto discussed is to be used to provide the required vector in the Y direction, the input to DAC 21 would produce an output therefrom at terminal 22 proportional to 3 units. Thus the output of DAC 21 represents the coordinate, while the output of DAC 12′ controls the speed at which the vector is drawn.

Comparison and control circuitry is required to compare the output voltage at terminals 15 and 22 and provide control signals. This circuitry determines whether the output signal at terminal 15 is higher or lower than the voltage output of DAC 21 and selects the polarity of the charging current $I_3$ for capacitor Cl accordingly. It also functions to turn off the switch shown in FIG. 6 when the voltage at terminal 15 equals the voltage at terminal 22 since, at that point, the desired coordinate in the X or Y direction has been reached.

The comparison and control circuitry is shown in one exemplary form thereof in FIGS. 7 and 8 and includes comparators 23 and 24; flip flops 25 and 26; and NAND gates 27, 28 and 29. These components are connected as shown in FIGS. 7 and 8.

Flip flop 25 has preset (PR) and clear (CL) input terminals and Q and $\overline{Q}$ output terminals. As is well known, if PR is 0, Q becomes 1 and $\overline{Q}$ becomes 0. If CL is 0, Q becomes 0 and $\overline{Q}$ becomes 1. A PR or CL of 1 effects no change.

Each comparator has two input terminals *23a, 23b; 24a, 24b* respectively and output terminals *23c* and *24c* respectively. As is well known, if the input at *23a* or *24a* is more positive than the input at *23b* or *24b* respectively, inversion will take place and the output at *23c* or *24c* respectively will be low (0). On the other hand, if the input at *23a* or *24a* is more negative than the input at *23b* or *24b* respectively, inversion will take place and the output at *23c* or *24c* respectively will be high (1). Likewise, if *23b* is more positive than *23a,* there will be no inversion and *23c* will be high. If *23b* is more negative than *23a,* there will be no inversion and *23c* will be low.

It will be noted that output terminal *23c* of comparator 23 is connected to PR of flip flop 25, while output terminal *24c* of comparator 24 is connected to CL of flip flop 25. Thus, when the voltage at terminal 15 is higher than the voltage at terminal 22, meaning that capacitor Cl must be charged negatively, the output of comparator 23 goes low and presets flip flop 25. On the other hand, when the voltage at terminal 15 is lower than the voltage at terminal 22, meaning that capacitor Cl must be charged positively, the output of comparator 24 goes low and clears flip flop 25. Thus the logic state of flip flop 25 indicates whether capacitor Cl should be charged positively or negatively. In this connection it should be noted that $\overline{Q}$ of flip flop 25 is connected to MSB of DAC 12′ and thus determines whether capacitor Cl is to be charged negatively or positively. One also may rely on the computer (FIG. 9) to provide this information.

Figure 6:
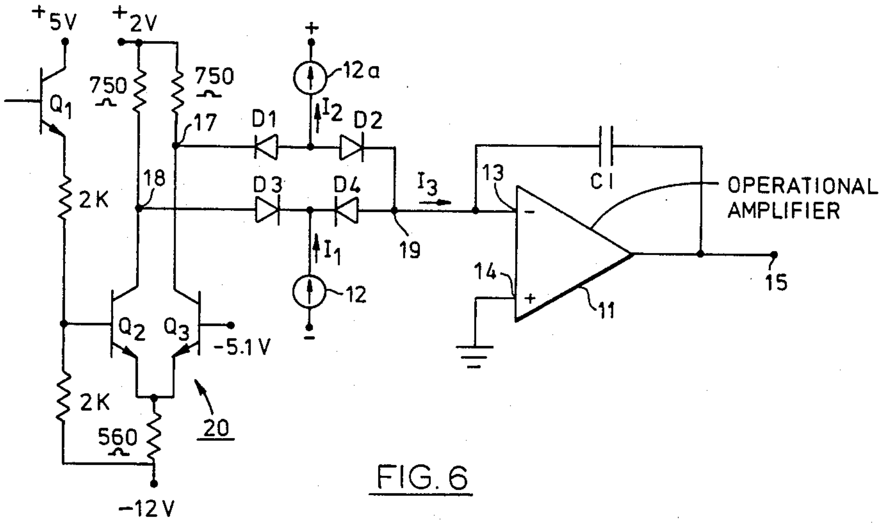

The comparison and control circuitry shown in FIGS. 7 and 8 not only determines the polarity of the charging current, an optional function thereof, but also controls the switch of FIG. 6 so that charging (or discharging) of capacitor Cl is stopped when the voltages at terminals 15 and 22 are equal, indicating that the desired coordinate has been reached. Thus, when capacitor Cl is charging or discharging and the voltage at terminal 15 becomes equal to the voltage at terminal 22, a transition occurs, flip flop 25 toggles and a pulse is produced that changes the state of the switch. How this works can best be illustrated by the following examples wherein it will be assumed that the voltage at terminal 15 is +1 volts and the voltage at terminal 22 is +2 volts. Under these circumstances the logic state of the various components hereinafter designated will be as follows:

Output of comparator 23: high
Output of comparator 24: low
Q of flip flop 25: low
$\overline{Q}$ of flip flop 25: high
Output of NAND gate 27: low
Output of NAND gate 28: high
Output of NAND gate 29: high To start the system a pulse is applied from the computer (FIG. 9) to the clock (CK) input of flip flop 26 via line 35. This causes Q of flip flop 26 to go high resulting in +4 volts being applied to the base of transistor Q1. In the manner previously explained, terminal 17 then becomes positive and terminal 18 negative resulting in capacitor Cl beginning to charge at a rate determined by DAC 12′. The charging of capacitor Cl increases the voltage appearing at terminal 15, and when it equals that at terminal 22, the output of comparator 23 changes to low and the output of comparator 24 to high. As a result, flip flop 25 is preset. However, because one input of NAND gate 27 is directly connected to the output of comparator 23, while the other input of NAND gate 27 is connected to $\overline{Q}$ of flip flop 25, before flip flop 25 toggles, the output of NAND gate 27 will go high. It then will go low again when flip flop 25 toggles. The resultant short pulse at the output of NAND gate 27 makes the output of NAND gate 28 go low momentarily clearing flip flop 26. As a result, 0 volts is applied to the base of transistor Q1 and the switch reverts to its off condition (capacitor Cl not charging) by virtue of terminals 17 and 18 becoming negative and positive respectively.

The short pulse at the output of NAND gate 27 can be fed back to the computer via line 30 (FIG. 8) to signal the computer that drawing of the vector is complete. At this time the computer then can reload DAC 12′ and DAC 21 with a new rate and a new coordinate respectively and then supply a start pulse on line 35 (FIG. 8) to clock input CK of flip flop 26 to turn the switch of FIG. 6 on again to draw another vector.

Figure 9:
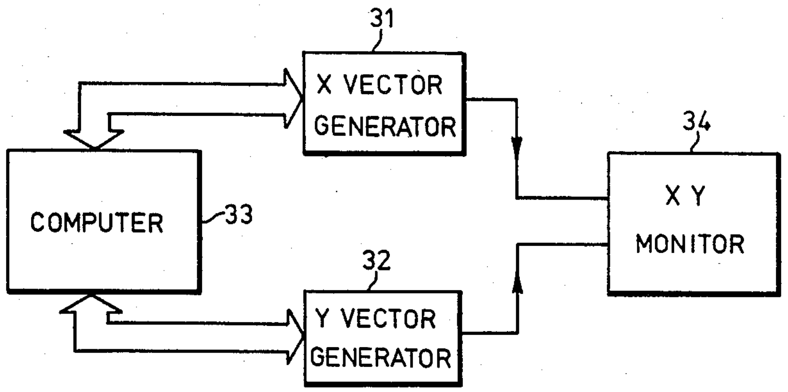
FIG. 9 is a schematic representation of an XY vector generating system embodying the present invention.

It will be understood, of course, that in order to draw vector 10 shown in FIG. 1, there must be an X vector generator and a Y vector generator. These are shown in FIG. 9 at 31 and 32 respectively, each of these vector generators being of the type shown in FIG. 8. Each is controlled by a computer 33 that supplies drawing rate and coordinate information for the DACs and starting pulses for flip flops 26. As previously indicated, computer 33 also may provide to the vector generators information as to the required polarity of the charging currents for capacitors Cl, thus taking over the function performed by connecting $\overline{Q}$ of flip flop 25 to MSB of DAC 12′. Computer 33 receives from vector generators 31 and 32 signals indicating when drawing of the vectors have been completed and, possibly, other information enabling computer 33 to monitor operation of vector generators 31 and 32. The outputs of vector generator 31 and 32 are applied to an XY monitor 34, more specifically to the X and Y deflection circuits thereof, to enable the required vectors to be drawn on the screen of the cathode ray tube thereof.

The term "computer" as used herein is to be understood as encompassing a microprocessor.

While preferred embodiments of this invention have been described and illustrated herein, the person skilled in the art will appreciate that changes and modifications may be made therein without departing from the spirit and scope of this invention as defined in the appended claims.

I claim:

1. A vector generator comprising first means for providing a signal indicative of the rate at which said vector is to be drawn, said first means comprising an operational amplifier having an output terminal and first and second input terminals, means connecting said first input terminal to a source of reference potential, a capacitor connected between said output terminal and said second input terminal, a constant current DAC having multiple input terminals and an output terminal at which a constant but variable output current is derived and a second constant current generator providing a constant current of opposite polarity to that of said DAC and one-half the magnitude of the maximum output current of said DAC, said DAC and said second constant current generator being connected to said second terminal and said capacitor in such a way that, depending on the magnitude of said output current of said DAC, said capacitor can be charged either positively or negatively; switching means having a first state and a second state, said switching means interconnecting said capacitor with both said DAC and said second constant current generator and enabling said capacitor to be charged in said first state of said switching means but preventing said capacitor from being charged in said second state of said switching means; second means for providing a signal indicative of the length of said vector to be drawn, said second means comprising a constant voltage DAC having multiple input terminals and an output terminal at which a constant but variable output voltage indicative of said length is derived; third means for comparing said output voltage of said constant voltage DAC and the voltage across said capacitor and generating a control signal when said voltages are equal; fourth means for utilizing said control signal to charge said state of said switching means from said first state thereof to said second state thereof to prevent further charging of said capacitor; fifth means for supplying to said input terminals of said constant current DAC a first signal that determines the rate at which said vector is to be drawn, to said input terminals of said constant voltage DAC a second signal that determines the length of said vector to be drawn and to said switching means a third signal that changes said state of said switching means from said second state to said first state thereof to enable said capacitor to be charged.

2. A vector generator according to claim 1 wherein said switching means includes first and second oppositely poled diodes series connected between said second input terminal of said constant current DAC and a first control signal terminal, third and fourth oppositely poled diodes series connected between said second input terminal of said constant current DAC and a second control signal terminal, said third and fourth diodes being oppositely poled to said first and second diodes, and sixth means responsive to said control signal generated when said voltages are equal and to said third signal for deriving and alternately switching the polarity of control signals applied to said first and second control signal terminals, whereby, when a control signal of one polarity is applied to said first control signal terminal, a control signal of opposite polarity is applied to said second control signal terminal and vice versa.

3. A vector generator according to claim 2 wherein said sixth means is a differential amplifier.

4. A vector generator according to claim 2 wherein said output terminal of said constant current DAC is connected to two like electrodes of said third and fourth diodes that are connected together and said second constant current generator is connected to two like electrodes of said first and second diodes that are connected together.

5. A vector generator according to claim 4 wherein said sixth means is a differential amplifier.

6. A vector generator according to claim 1 wherein said third means also provides a signal indicating whether said capacitor should be charged or discharged, and means for supplying the latter signal to the MSB input terminal of said constant current DAC.

7. A vector generator according to claim 1 wherein said fifth means is a computer.

8. A vector generator according to claim 1 including means for deriving and supplying to the MSB input terminal of said constant current DAC a signal which indicates whether said capacitor should be charged positively or negatively.

9. A vector generator according to claim 8 wherein said deriving and supplying means is said fifth means.

10. A vector generator according to claim 9 wherein said fifth means is a computer.

11. A vector generator and display device comprising first and second vector generators each according to claim 1 and having said fifth means thereof common, one of said vector generators generating a vector in the X direction, the other of said vector generators generating a vector in the Y direction, an XY monitor including a cathode ray tube having X deflection circuitry and Y deflection circuitry, means for supplying the voltage derived across said capacitor of said X vector generator to said X deflection circuitry, and means for supplying the voltage derived across said capacitor of said Y vector generator to said Y deflection circuitry.

12. Apparatus according to claim 11 wherein said fifth means is a computer.

13. Apparatus according to claim 11 including for each said vector generator means for deriving and supplying to the MSB input terminal of said constant current DAC thereof a signal which indicates whether said capacitor thereof should be charged positively or negatively.

14. Apparatus according to claim 13 wherein said deriving and supplying means is said fifth means.

15. Apparatus according to claim 14 wherein said fifth means is a computer.

16. Apparatus according to claim 11 wherein for each said vector generator said third means also provides a signal indicating whether said capacitor thereof should be charged or discharged, and means for supplying the latter signal to the MSB input terminal of said constant current DAC thereof.

* * * * *